United States Patent
Liu et al.

(10) Patent No.: US 8,927,966 B2
(45) Date of Patent: Jan. 6, 2015

(54) DYNAMIC RANDOM ACCESS MEMORY UNIT AND METHOD FOR FABRICATING THE SAME

(71) Applicant: Tsinghua University, Beijing (CN)

(72) Inventors: Libin Liu, Beijing (CN); Renrong Liang, Beijing (CN); Jing Wang, Beijing (CN); Jun Xu, Beijing (CN)

(73) Assignee: Tsinghua University (CN)

( * ) Notice: Subject to any disclaimer, the term of this patent is extended or adjusted under 35 U.S.C. 154(b) by 149 days.

(21) Appl. No.: 13/703,722

(22) PCT Filed: Oct. 18, 2012

(86) PCT No.: PCT/CN2012/083158
§ 371 (c)(1),
(2) Date: Dec. 12, 2012

(87) PCT Pub. No.: WO2013/174094
PCT Pub. Date: Nov. 28, 2013

(65) Prior Publication Data
US 2014/0054546 A1    Feb. 27, 2014

(30) Foreign Application Priority Data

May 22, 2012 (CN) .......................... 2012 1 0161248
May 22, 2012 (CN) .......................... 2012 1 0161290

(51) Int. Cl.
*H01L 31/00* (2006.01)
*H01L 29/78* (2006.01)
(Continued)

(52) U.S. Cl.
CPC .......... *H01L 29/775* (2013.01); *H01L 29/7841* (2013.01); *H01L 29/66439* (2013.01); *H01L 27/10802* (2013.01); *H01L 29/78* (2013.01); *H01L 21/84* (2013.01); *H01L 29/66795* (2013.01); *H01L 27/10844* (2013.01); *H01L 29/785* (2013.01); *H01L 27/1203* (2013.01)

USPC .......................................................... 257/24

(58) Field of Classification Search
USPC .......................................................... 257/24
See application file for complete search history.

(56) References Cited

U.S. PATENT DOCUMENTS 6,888,200 B2    5/2005 Bhattacharyya
7,291,519 B2 *  11/2007 Bhattacharyya .............. 438/149
(Continued)

FOREIGN PATENT DOCUMENTS

| CN | 101582426 | 6/2011 |
| CN | 102184926 A | 9/2011 |

(Continued)

OTHER PUBLICATIONS

International Search Report for Application No. PCT/CN2012/083158 dated Mar. 7, 2013.

*Primary Examiner* — Yu-Hsi D Sun
*Assistant Examiner* — Grant Withers
(74) *Attorney, Agent, or Firm* — Lerner, David, Littenberg, Krumholz & Mentlik, LLP (57) ABSTRACT

A dynamic random access memory unit and a method for fabricating the same are provided. The dynamic random access memory unit comprises: a substrate; an insulating buried layer formed on the substrate; a body region formed on the insulating buried layer and used as a charge storing region; two isolation regions formed on the body region, in which a semiconductor contact region is formed between the isolation regions and is a charge channel; a source, a drain and a channel region formed on the isolation regions and the semiconductor contact region respectively and constituting a transistor operating region which is partially separated from the charge storing region by the isolation regions and connected with the charge storing region via the charge channel; a gate dielectric layer formed on the transistor operating region, a gate formed on the gate dielectric layer; a source metal contact layer, a drain metal contact layer.

8 Claims, 9 Drawing Sheets

(51) Int. Cl.
*H01L 29/66* (2006.01)
*H01L 27/108* (2006.01)
*H01L 21/84* (2006.01)
*H01L 29/775* (2006.01)
*H01L 27/12* (2006.01)

(56) References Cited

U.S. PATENT DOCUMENTS

| | | | |
|---|---|---|---|
| 2007/0001165 A1* | 1/2007 | Ranica et al. | 257/19 |
| 2008/0099811 A1* | 5/2008 | Tak et al. | 257/297 |
| 2009/0108292 A1* | 4/2009 | Liu et al. | 257/190 |
| 2010/0006939 A1* | 1/2010 | Kim et al. | 257/347 |
| 2010/0252800 A1* | 10/2010 | Chidambarrao et al. | 257/9 |
| 2011/0042746 A1* | 2/2011 | Tak et al. | 257/348 |
| 2014/0051214 A1* | 2/2014 | Liu et al. | 438/151 |
| 2014/0054546 A1* | 2/2014 | Liu et al. | 257/24 |

FOREIGN PATENT DOCUMENTS

| | | |
|---|---|---|
| CN | 102683347 A | 9/2012 |
| CN | 102683418 A | 9/2012 |

* cited by examiner

DYNAMIC RANDOM ACCESS MEMORY UNIT AND METHOD FOR FABRICATING THE SAME

CROSS-REFERENCE TO RELATED APPLICATIONS

The present application is a national phase entry under 35 U.S.C. §371 of International Application No. PCT/CN2012/083158 filed Oct. 18, 2012, published in Chinese, which claims priority from Chinese Patent Application No. 201210161290.9, filed on May 22, 2012 and Chinese Patent Application No. 201210161248.7, filed on May 22, 2012, all of which are incorporated herein by reference.

FIELD

The present disclosure relates to semiconductor design and fabrication field, and more particularly to a dynamic random access memory unit and a method for fabricating the same.

BACKGROUND

With a continuous scaling down of a size of a dynamic random access memory (DRAM) unit, an integration becomes higher and higher. On one hand, a difficulty in integrating one transistor and one capacitor together becomes higher and higher. On the other hand, due to the destructive reading and writing modes of the DRAM unit for stored information and short data retention time of the DRAM unit, a power consumption caused by refreshing may be continuously increased. Therefore, recently, a (1T) DRAM unit comprising one transistor without a capacitor has drawn extensive attention. Compared with a conventional (1T1C) DRAM unit comprising one transistor and one capacitor, the (1T) DRAM unit comprises one transistor without a capacitor, so the process is simpler and is compatible with a CMOS (complementary metal oxide semiconductor) process and the stored information may not be destroyed during the reading or writing. Thus, longer data retention time may be achieved.

Figure 1:
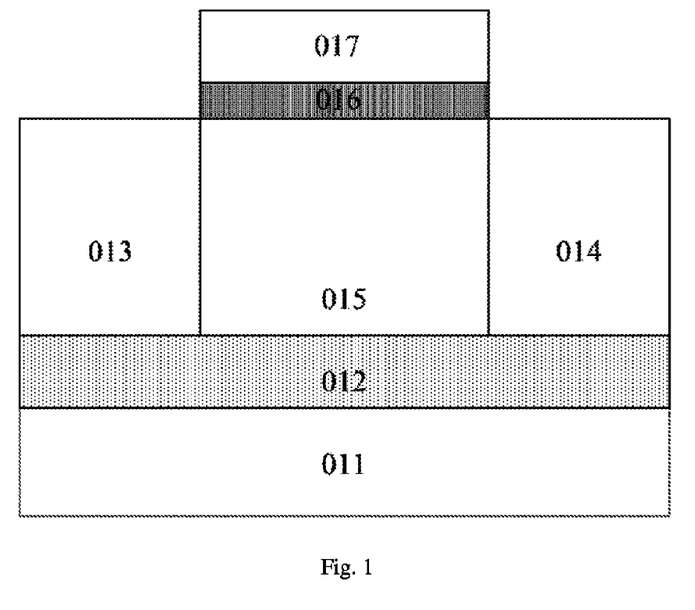
FIG. 1 is a schematic cross-sectional view of a conventional (1T) DRAM unit.

FIG. 1 shows a schematic cross-sectional view of this (1T) DRAM unit. As shown in FIG. 1, this (1T) DRAM unit comprises: a substrate 011; an insulating buried layer 012 formed on the substrate 011; a source 013, a drain 014 and a body region 015 formed on the insulating buried layer 012 respectively, in which the body region 015 is formed between the source 013 and the drain 014; and a gate dielectric layer 016 formed on the body region 015, and a gate 017 formed on the gate dielectric layer 016. A p-type doped body region 015, an n-type doped source 013 and an n-type doped drain 014 are taken as an example. When the (1T) DRAM unit operates, holes generated by the (1T) DRAM unit are stored in an accumulation layer formed between the body region 015 and the insulating buried layer 012, in which the accumulation layer is next to the n-type doped source 013 and the n-type doped drain 014. The holes stored in this way may be easily collected by an off-state leakage current of the source 013 and the drain 014, and the stored holes may disappear quickly due to a carrier recombination effect. Therefore, a data retention time may be limited, thus narrowing an application field of the (1T) DRAM unit.

SUMMARY

Embodiments of the present disclosure seek to solve at least one of the problems existing in the prior art to at least some extent. Accordingly, a dynamic random access memory unit and a method for fabricating the same are provided.

According to a first aspect of the present disclosure, a dynamic random access memory unit is provided. The dynamic random access memory unit comprises: a substrate; an insulating buried layer formed on the substrate; a body region formed on the insulating buried layer and used as a charge storing region; two isolation regions formed on the body region, in which a material of the two isolation regions is nonconductive, and a semiconductor contact region is formed between the two isolation regions and is a charge channel; a source, a drain and a channel region formed on the two isolation regions and the semiconductor contact region respectively and constituting a transistor operating region, in which the transistor operating region is spatially partially separated from the charge storing region by the two isolation regions, and the transistor operating region is connected with the charge storing region via the charge channel; a gate dielectric layer formed on the transistor operating region, and a gate formed on the gate dielectric layer; and a source metal contact layer formed on the source, and a drain metal contact layer formed on the drain.

With the dynamic random access memory unit according to an embodiment of the present disclosure, because carries generated during the operation of the transistor are stored in the charge storing region, and because the transistor operating region is spatially separated from the charge storing region, when the transistor operates, charges stored in the charge storing region may not leak, thus increasing a data retention time.

In one embodiment, the dynamic random access memory unit further comprises: an isolation trench formed on peripheries of the body region, the two isolation regions and the transistor operating region, thus preventing charges accumulated in a charge accumulation layer formed between the body region and the insulating buried layer of one dynamic random access memory unit from leaking into other dynamic random access memory units.

In one embodiment, the transistor operating region, the gate dielectric layer, the gate, the source metal contact layer and the drain metal contact layer constitute a FinFET (fin field effect transistor) structure, thus increasing a reading speed and a writing speed because an operating current of a FinFET device is large.

In one embodiment, a length of the charge channel in a channel direction of the channel region is about 5 nm to about 100 nm, and a depth of the charge channel in a depth direction vertical to the transistor operating region is about 2 nm to about 50 nm.

In one embodiment, the body region comprises a quantum well for storing a carrier, thus increasing a data retention time dramatically and increasing a maximum refresh time.

In one embodiment, when the channel region is p-type doped, the body region is an intrinsic region or a p-type doped region, a material of a potential well layer of the quantum well is strained SiGe, and a material of a potential barrier layer of the quantum well is relaxed Si.

In one embodiment, when the channel region is n-type doped, the body region is an intrinsic region or an n-type doped region, a material of a potential barrier layer of the quantum well is relaxed SiGe, and a material of a potential well layer of the quantum well is strained Si.

In one embodiment, the dynamic random access memory unit further comprises: a passivation layer formed on an upper surface of the transistor operating region which is not covered by the gate dielectric layer, the source metal contact layer or the drain metal contact layer, thus preventing a charge leakage.

According to a second aspect of the present disclosure, a method for fabricating a dynamic random access memory unit is provided. The method comprises steps of: S1) providing a substrate; S2) forming an insulating buried layer on the substrate; S3) forming a body region on the insulating buried layer, in which the body region is used as a charge storing region; S4) forming an isolation layer on the body region; S5) performing a lithography and etching a portion of the isolation layer until a first portion of the body region is exposed to form two isolation regions, and forming a semiconductor contact region between the two isolation regions, in which the semiconductor contact region is a charge channel; S6) forming an epitaxial layer on the two isolation regions and the semiconductor contact region, and forming a source, a drain and a channel region in the epitaxial layer respectively, in which the source, the drain and the channel region constitute a transistor operating region, the transistor operating region is spatially partially separated from the charge storing region by the two isolation regions, and the transistor operating region is connected with the charge storing region via the charge channel; S7) forming a gate dielectric layer on the transistor operating region, and forming a gate on the gate dielectric layer; and S8) forming a source metal contact layer on the source, and forming a drain metal contact layer on the drain.

With the method for fabricating the dynamic random access memory unit according to an embodiment of the present disclosure, the process is simple and is compatible with a CMOS process; and with the dynamic random access memory unit fabricated by the method, during the reading, the charges stored in the body region may not be destroyed, thus increasing the maximum refresh time.

In one embodiment, between Step S6) and Step S7), the method further comprises: forming an isolation trench on peripheries of the body region, the two isolation regions and the transistor operating region, and filling an insulating isolation dielectric in the isolation trench, thus preventing charges accumulated in a charge accumulation layer formed between the body region and the insulating buried layer of one dynamic random access memory unit from leaking into other dynamic random access memory units.

In one embodiment, the transistor operating region, the gate dielectric layer, the gate, the source metal contact layer and the drain metal contact layer constitute a FinFET structure, thus increasing a reading speed and a writing speed because an operating current of a FinFET device is large.

In one embodiment, a material of the two isolation regions is nonconductive.

In one embodiment, a conductive material is used to form the isolation layer on the body region, and after the transistor operating region is formed, the conductive material in the two isolation regions is removed and a nonconductive material is filled in the two isolation regions.

In one embodiment, a length of the charge channel in a channel direction of the channel region is about 5 nm to about 100 nm, and a depth of the charge channel in a depth direction vertical to the transistor operating region is about 2 nm to about 50 nm.

In one embodiment, the method further comprises: forming a quantum well for storing a carrier in the body region, thus increasing a data retention time dramatically and increasing a maximum refresh time.

In one embodiment, when the channel region is p-type doped, the body region is an intrinsic region or a p-type doped region, a material of a potential well layer of the quantum well is strained SiGe, and a material of a potential barrier layer of the quantum well is relaxed Si; and when the channel region is n-type doped, the body region is an intrinsic region or an n-type doped region, the material of the potential barrier layer of the quantum well is relaxed SiGe, and the material of the potential well layer of the quantum well is strained Si.

In one embodiment, in Step S4), the isolation layer with a thickness of 2 nm to 50 nm is formed by oxidizing an upper surface layer of the body region.

In one embodiment, in Steps S4)-S6), the two isolation regions and the transistor operating region are formed by: coating a photoresist and performing a lithography until a second portion of the body region is exposed; ion-implanting oxygen in the second portion of the body region to form an oxygen ion-implanted region, removing the photoresist, and performing a high-temperature annealing to form the two isolation regions, in which the first portion of the body region between the two isolation regions is the semiconductor contact region, and the semiconductor contact region is the charge channel; and forming the source, the drain and the channel region on the two isolation regions and the semiconductor contact region respectively, in which the source, the drain and the channel region constitute the transistor operating region, the transistor operating region is spatially partially separated from the charge storing region by the two isolation regions, and the transistor operating region is connected with the charge storing region via the charge channel.

In one embodiment, after Step S8), the method further comprises: forming a passivation layer on an upper surface of the transistor operating region which is not covered by the gate dielectric layer, the source metal contact layer or the drain metal contact layer, thus preventing a charge leakage.

In one embodiment, the passivation layer is formed by chemical vapor deposition.

Additional aspects and advantages of embodiments of present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to the accompanying drawings, in which.

REFERENCE NUMERALS 011 substrate; 012 insulating buried layer; 013 source; 014 drain; 015 body region; 016 gate dielectric layer; 017 gate; 1 substrate; 2 insulating buried layer; 3 body region; 4 isolation region; 5 source; 6 drain; 7 channel region; 8 gate dielectric layer; 9 gate; 10 source metal contact layer; 11 drain metal contact layer; 12 isolation trench; 13 passivation layer; 14 side wall; 15 isolation layer; 16 photoresist layer; 17 first semiconductor layer; 18 second semiconductor layer; 19 Fin structure; 201 potential barrier layer of a quantum well; 202 potential well layer of a quantum well; 21 semiconductor contact region.

DETAILED DESCRIPTION

Reference will be made in detail to embodiments of the present disclosure. The embodiments described herein with reference to drawings are explanatory, illustrative, and used to generally understand the present disclosure. The embodiments shall not be construed to limit the present disclosure. The same or similar elements and the elements having same or similar functions are denoted by like reference numerals throughout the descriptions.

Various embodiments and examples are provided in the following description to implement different structures of the present disclosure. In order to simplify the present disclosure, certain elements and settings will be described. However, these elements and settings are only by way of example and are not intended to limit the present disclosure. In addition, reference numerals may be repeated in different examples in the present disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied. Moreover, a structure in which a first feature is "on" a second feature may include an embodiment in which the first feature directly contacts the second feature, and may also include an embodiment in which an additional feature is formed between the first feature and the second feature so that the first feature does not directly contact the second feature.

The dynamic random access memory unit according to embodiments of the present disclosure will be described below in detail with reference to the drawings.

Embodiment 1

Figure 2:
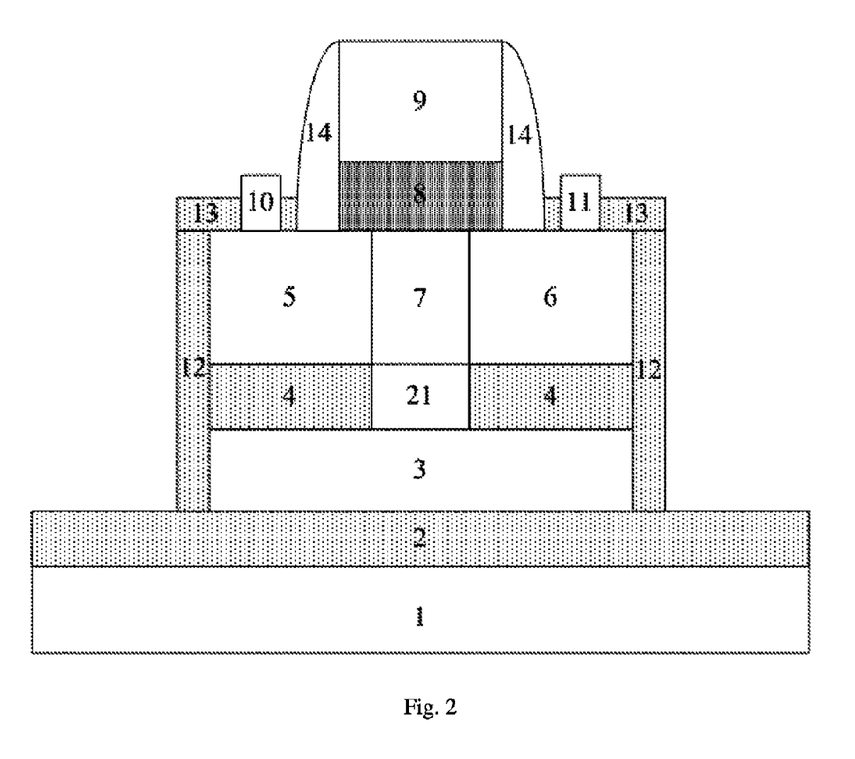
FIG. 2 is a schematic cross-sectional view of a dynamic random access memory unit according to a first embodiment of the present disclosure.

FIG. 2 is a schematic cross-sectional view of a dynamic random access memory unit according to a first embodiment of the present disclosure. It should be noted that the size of individual regions of the dynamic random access memory unit are merely schematically given in FIG. 2, and it would be appreciated by those skilled in the art that the particular size of individual regions of the dynamic random access memory unit may be designed according to the requirements of device parameters.

As shown in FIG. 2, the dynamic random access memory unit according to the first embodiment of the present disclosure comprises: a substrate 1; an insulating buried layer 2 formed on the substrate 1; a body region 3 formed on the insulating buried layer 2 and used as a charge storing region; two isolation regions 4 formed on the body region 3, in which a material of the two isolation regions 4 is nonconductive, and a semiconductor contact region 21 is formed between the two isolation regions 4 and is a charge channel; a source 5, a drain 6 and a channel region 7 formed on the two isolation regions 4 and the semiconductor contact region 21 respectively and constituting a transistor operating region, in which the transistor operating region is spatially partially separated from the charge storing region by the two isolation regions 4, and the transistor operating region is connected with the charge storing region via the charge channel; a gate dielectric layer 8 formed on the transistor operating region, and a gate 9 formed on the gate dielectric layer 8; and a source metal contact layer 10 formed on the source 5, and a drain metal contact layer 11 formed on the drain 6.

As shown in FIG. 2, the dynamic random access memory unit according to the first embodiment of the present disclosure comprises the substrate 1. A material of the substrate 1 may be any substrate material for fabricating the dynamic random access memory unit. Particularly, the material of the substrate 1 may be, but is not limited to, silicon on insulator (SOI), silicon (Si), germanium (Ge) or gallium arsenide (GaAs). In this embodiment, the material of the substrate 1 may be preferably SOI.

The insulating buried layer 2 is formed on the substrate 1. A material of the insulating buried layer 2 is an insulating material. Particularly, the material of the insulating buried layer 2 may be, but is not limited to, an oxide of silicon or an oxide of germanium.

The body region 3 is formed on the insulating buried layer 2 and used as the charge storing region. Particularly, a material of the body region 3 may be, but is not limited to, silicon, germanium or gallium arsenide. In this embodiment, the material of the body region 3 may be preferably single-crystal silicon. When the channel region 7 is p-type doped, the body region 3 is an intrinsic region or a p-type doped region. When the channel region 7 is n-type doped, the body region 3 is an intrinsic region or an n-type doped region.

Two isolation regions 4 are formed on the body region 3. A material of the two isolation regions 4 is nonconductive. The semiconductor contact region 21 is formed between the two isolation regions 4 and is the charge channel. Particularly, the material of the two isolation regions 4 may be, but is not limited to, an oxide of silicon or an oxide of germanium. In this embodiment, preferably, the material of the two isolation regions 4 may be an oxide of silicon. Each isolation region 4 has a thickness of 2 nm to 50 nm.

The source 5, the drain 6 and the channel region 7 are formed on the two isolation regions 4 and the semiconductor contact region 21 respectively and constitute the transistor operating region, in which the channel region 7 is located between the source 5 and the drain 6. The transistor operating region is spatially partially separated from the charge storing region by the two isolation regions 4, and the transistor operating region is connected with the charge storing region via the charge channel. A length of the charge channel in a channel direction of the channel region 7 is about 5 nm to about 100 nm, and a depth of the charge channel in a depth direction vertical to the transistor operating region is about 2 nm to about 50 nm. As used herein, the term "channel direction of the channel region 7" refers to a direction along a straight line connecting the source 5 with the drain 6.

The gate dielectric layer 8 is formed on the transistor operating region, and the gate 9 is formed on the gate dielectric layer 8. Particularly, a material of the gate dielectric layer 8 may be, but is not limited to, a high k dielectric or silicon dioxide ($SiO_2$). Particularly, a material of the gate 9 may be, but is not limited to, poly-silicon or a metal.

The source metal contact layer 10 is formed on the source 5, and the drain metal contact layer 11 is formed on the drain 6. In this embodiment, an ohmic contact is formed between the source metal contact layer 10 and the source 5, and an ohmic contact is formed between the drain metal contact layer 11 and the drain 6. Particularly, a material of an interface between the source metal contact layer 10 and the source 5 and an interface between the drain metal contact layer 11 and the drain 6 may be, but is not limited to, a metal-semiconductor alloy, such as a metal silicide.

In one embodiment, the dynamic random access memory unit according to the first embodiment of the present disclosure may further comprise an isolation trench 12. The isolation trench 12 is formed on peripheries of the body region 3, the two isolation regions 4 and the transistor operating region. An insulating isolation medium is filled in the isolation trench 12. Particularly, the insulating isolation medium may be, but is not limited to, an oxide of silicon. The isolation trench 12 is used for isolating one dynamic random access memory unit from other dynamic random access memory units, thus preventing charges accumulated in a charge accumulation layer formed between the body region 3 and the insulating buried layer 2 of the one dynamic random access memory unit from leaking into the other dynamic random access memory units.

Figure 13:
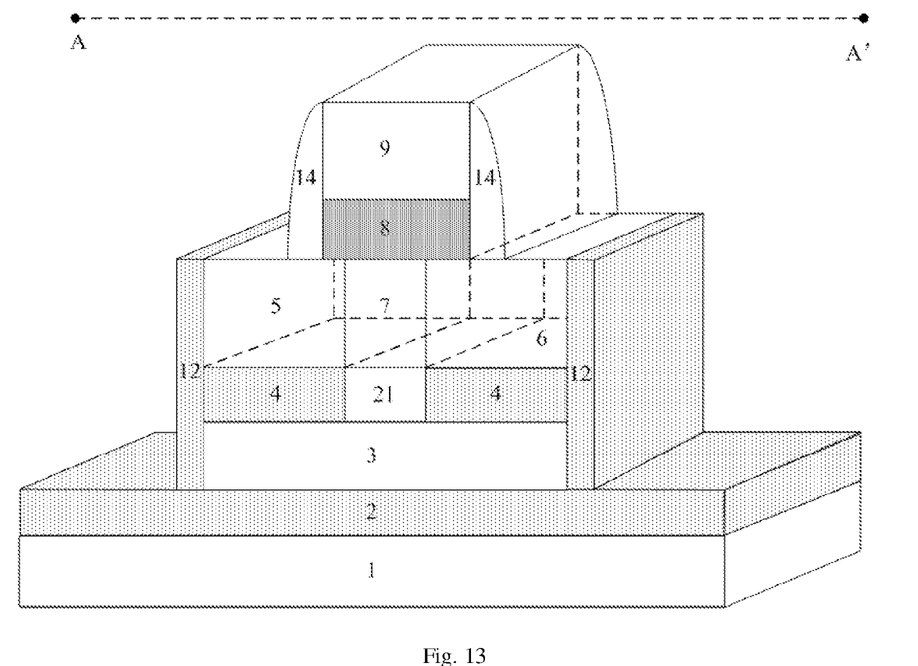

In one embodiment, as shown in FIG. 13, the dynamic random access memory unit according to the first embodiment of the present disclosure may further comprise a side wall 14. The side wall 14 is formed on each side of a gate stack constituted by the gate dielectric layer 8 and the gate 9.

In one embodiment, the dynamic random access memory unit according to the first embodiment of the present disclosure may further comprise a passivation layer 13. In one embodiment, the passivation layer 13 is formed on an upper surface of the transistor operating region which is not covered by the gate dielectric layer 8, the source metal contact layer 10 or the drain metal contact layer 11. In another embodiment, if the side wall 14 is formed on each side of the gate stack, the passivation layer 13 is formed on an upper surface of the transistor operating region which is not covered by the gate dielectric layer 8, the source metal contact layer 10, the drain metal contact layer 11 or the side wall 14. Particularly, a material of the passivation layer 13 may be, but is not limited to, an oxide of silicon or a nitride of silicon. The passivation layer 13 may passivate a surface of the transistor operating region, thus preventing a charge leakage.

In one embodiment, the dynamic random access memory unit according to the first embodiment of the present disclosure may further comprise a substrate electrode (not shown). The substrate electrode is formed below the substrate 1.

In one embodiment, the dynamic random access memory unit according to the first embodiment of the present disclosure may further comprise a plurality of metallic interconnections (not shown). The plurality of metallic interconnections are connected with the source metal contact layer 10, the drain metal contact layer 11 and the gate 9 respectively.

With the dynamic random access memory unit according to an embodiment of the present disclosure, because carries generated during the operation of the transistor are stored in the charge storing region, and because the transistor operating region is spatially separated from the charge storing region, when the transistor operates, charges stored in the charge storing region may not leak, thus increasing a data retention time.

Embodiment 2

Figure 15:
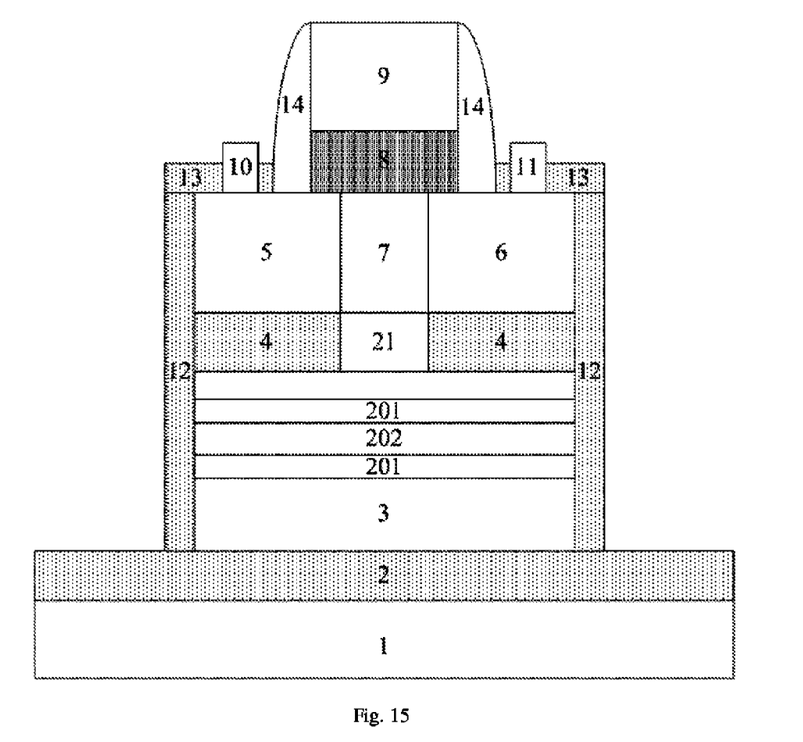
FIG. 15 is a schematic cross-sectional view of a dynamic random access memory unit according to a second embodiment of the present disclosure.

FIG. 15 is a schematic cross-sectional view of a dynamic random access memory unit according to a second embodiment of the present disclosure. The dynamic random access memory unit according to the second embodiment of the present disclosure is substantially the same as the dynamic random access memory unit according to the first embodiment of the present disclosure, with the following exceptions. In this embodiment, as shown in FIG. 15, the body region 3 comprises a quantum well for storing a carrier. It should be noted that as shown in FIG. 15, this embodiment is illustrated by taking one quantum well as an example, however, the particular number of the quantum wells may be designed according to practical parameter requirements. When the channel region 7 is p-type doped, the body region 3 is an intrinsic region or a p-type doped region, a material of a potential well layer 202 of the quantum well is strained SiGe, and a material of a potential barrier layer 201 of the quantum well is relaxed Si, so as to store holes. When the channel region 7 is n-type doped, the body region 3 is an intrinsic region or an n-type doped region, the material of the potential barrier layer 201 of the quantum well is relaxed SiGe, and the material of the potential well layer 202 of the quantum well is strained Si, so as to store electrons.

With the dynamic random access memory unit according to an embodiment of the present disclosure, the quantum well for storing carriers is introduced in a carrier storing region (i.e., the body region), thus increasing the data retention time dramatically and increasing a maximum refresh time.

Embodiment 3

Figure 16:
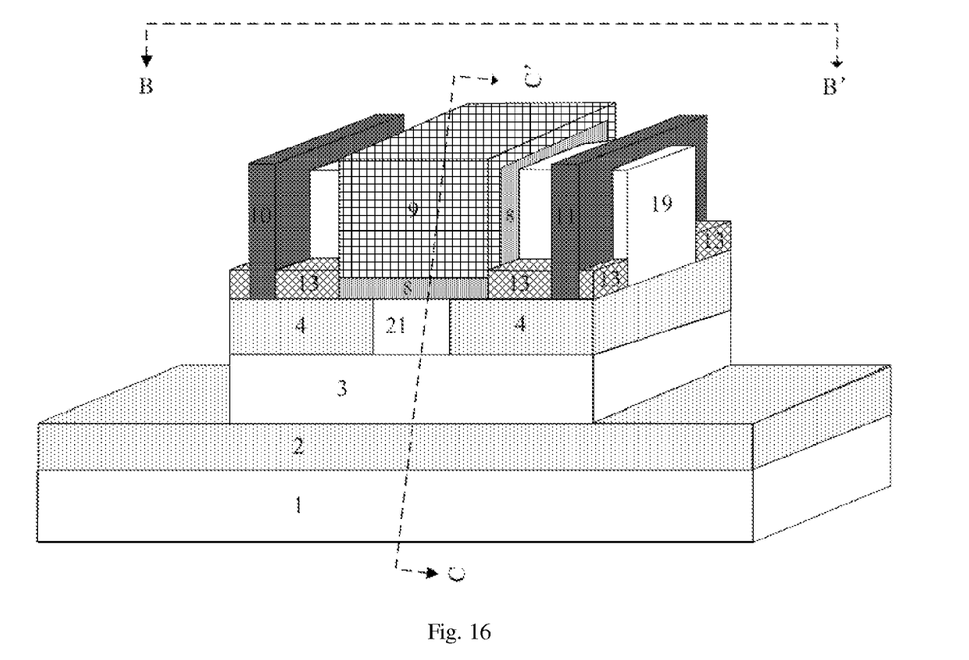
FIG. 16 is a schematic perspective view of a dynamic random access memory unit according to a third embodiment of the present disclosure.
Figure 17:
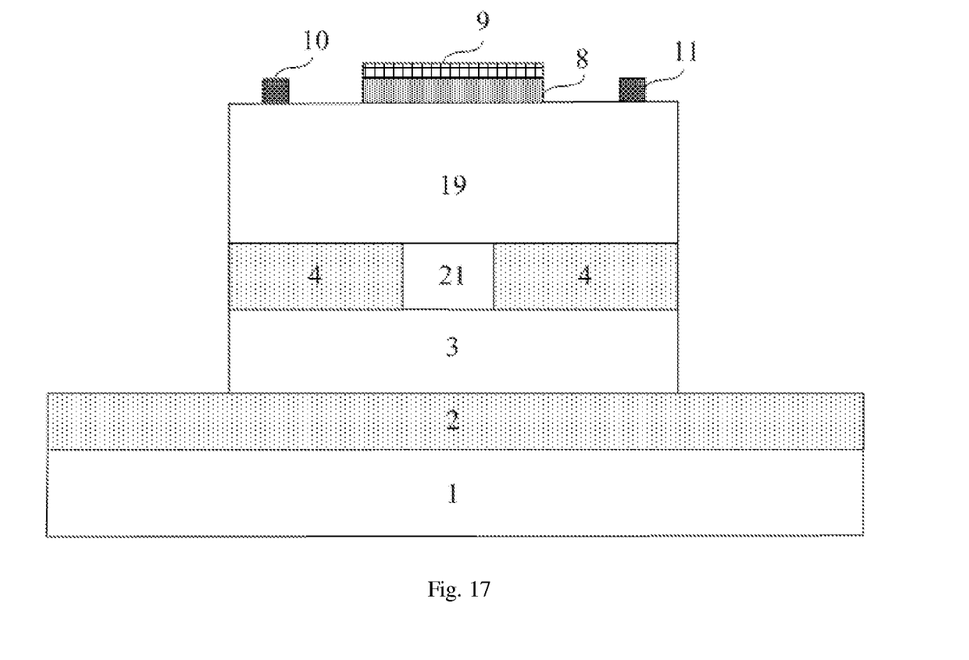
FIG. 17 is a schematic cross-sectional view of the dynamic random access memory unit shown in FIG. 16 along a line BB' in FIG. 16.
Figure 18:
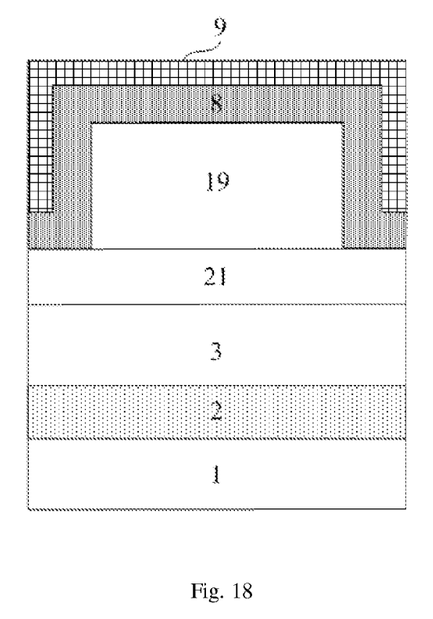
FIG. 18 is a schematic cross-sectional view of the dynamic random access memory unit shown in FIG. 16 along a line CC' in FIG. 16.

FIG. 16 is a schematic perspective view of a dynamic random access memory unit according to a third embodiment of the present disclosure. FIG. 17 is a schematic cross-sectional view of the dynamic random access memory unit shown in FIG. 16 along a line BB' in FIG. 16. FIG. 18 is a schematic cross-sectional view of the dynamic random access memory unit shown in FIG. 16 along a line CC' in FIG. 16. The dynamic random access memory unit according to the third embodiment of the present disclosure is substantially the same as the dynamic random access memory unit according to the first embodiment of the present disclosure, with the following exceptions. In this embodiment, as shown in FIGS. 16-18, the transistor operating region, the gate dielectric layer 8, the gate 9, the source metal contact layer 10 and the drain metal contact layer 11 constitute a FinFET structure. The FinFET structure comprises a Fin structure 19. As shown in FIG. 16, the Fin structure 19 is formed on the two isolation regions 4 and the semiconductor contact region 21, and the source 5, the drain 6 and the channel region 7 are formed in the Fin structure 19 respectively. The gate dielectric layer 8 is formed on the Fin structure 19 and is in contact with the two isolation regions 4 and the semiconductor contact region 21, and the gate 9 is formed on the gate dielectric layer 8. The source metal contact layer 10 is formed on the source 5, and the drain metal contact layer 11 is formed on the drain 6. The passivation layer 13 is formed on upper surfaces of the two isolation regions 4 which are not covered by the Fin structure 19, the gate dielectric layer 8, the source metal contact layer 10 or the drain metal contact layer 11.

In order to facilitate a display, the isolation trench 12 is not shown in FIG. 16. It should be noted that in fact, the dynamic random access memory unit according to the third embodiment of the present disclosure may further comprise the isolation trench 12. The isolation trench 12 is formed on peripheries of the body region 3 and the two isolation regions 4 for isolating one dynamic random access memory unit from other dynamic random access memory units, thus preventing charges accumulated in a charge accumulation layer formed between the body region 3 and the insulating buried layer 2 of the one dynamic random access memory unit from leaking into the other dynamic random access memory units.

With the dynamic random access memory unit according to an embodiment of the present disclosure, generated carriers are stored in the body region below a transistor, and a threshold voltage of a device may be changed by using the substrate bias effect of the transistor and by modulating charges in the body region of the device, so as to achieve the purpose of storing information. With the dynamic random access memory unit according to an embodiment of the present disclosure, the reading speed and the writing speed may be increased by using the FinFET structure; the read operation may be achieved by detecting the threshold voltage, so that the dynamic random access memory unit may be simple in principle and high in speed; and when formed into an array, individual dynamic random access memory units are relatively independent and may be arranged in different directions, thus enhancing the design freedom. With the dynamic random access memory unit according to an embodiment of the present disclosure, the "1" write operation may be achieved by injecting charges into the interior of the body region using the hot electron injection, and the "0" write operation may be achieved by dissipating the stored charges by forward biasing a source/substrate junction or a drain/substrate junction. In this way, a high write speed may be achieved because an operating current of a FinFET device is large.

The method for fabricating the dynamic random access memory unit according to embodiments of the present disclosure will be described below in detail with reference to the drawings.

Embodiment 4

A method for fabricating a dynamic random access memory unit according to a fourth embodiment of the present disclosure is used for fabricating the dynamic random access memory unit according to the first embodiment of the present disclosure. FIGS. 3-14 are schematic cross-sectional views or schematic perspective views of intermediate statuses of the dynamic random access memory unit shown in FIG. 2 formed in steps of a method for fabricating the dynamic random access memory unit shown in FIG. 2. As shown in FIGS. 3-14, the method for fabricating the dynamic random access memory unit according to the fourth embodiment of the present disclosure comprises the following steps.

Figure 3:
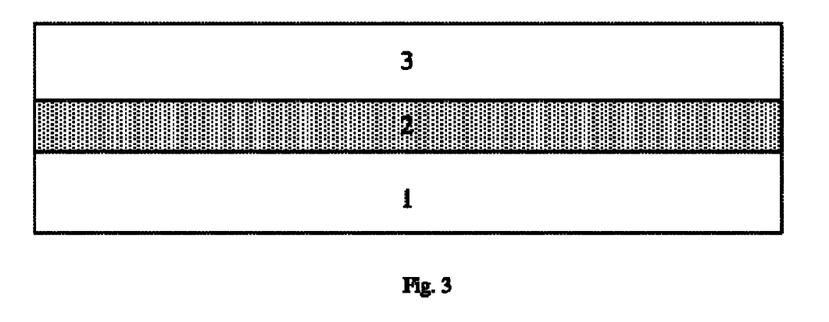
FIGS. 3-14 are schematic cross-sectional views or schematic perspective views of intermediate statuses of the dynamic random access memory unit shown in FIG. 2 formed in steps of a method for fabricating the dynamic random access memory unit shown in FIG. 2.

Step S1): a substrate 1 is provided, as shown in FIG. 3. A material of the substrate 1 may be any substrate material for fabricating the dynamic random access memory unit. Particularly, the material of the substrate 1 may be, but is not limited to, SOI, silicon, germanium or gallium arsenide. In this embodiment, the material of the substrate 1 may be preferably SOI.

Step S2): an insulating buried layer 2 is formed on the substrate 1. A material of the insulating buried layer 2 is an insulating material. Particularly, the material of the insulating buried layer 2 may be, but is not limited to, an oxide of silicon or an oxide of germanium. A particular process for forming the insulating buried layer 2 may be, but is not limited to, chemical vapor deposition.

Step S3): a body region 3 is formed on the insulating buried layer 2 and used as a charge storing region. Particularly, a material of the body region 3 may be, but is not limited to, silicon, germanium or gallium arsenide. In this embodiment, the material of the body region 3 may be preferably single-crystal silicon. A particular process for forming the body region 3 may be, but is not limited to, chemical vapor deposition.

Figure 4:
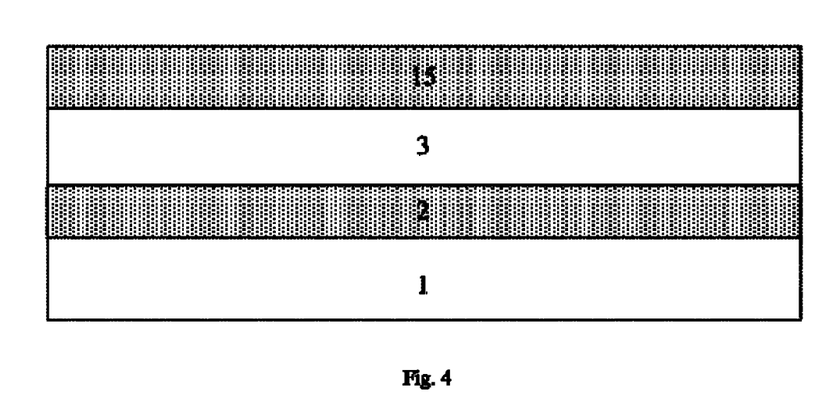

Step S4): an isolation layer 15 is formed on the body region 3, as shown in FIG. 4. Particularly, a material of the isolation layer 15 may be, but is not limited to, an oxide of silicon or an oxide of germanium. Preferably, the material of the isolation layer 15 may be an oxide of silicon. A particular process for forming the isolation layer 15 may be, but is not limited to, chemical vapor deposition or oxidation. In this embodiment, the isolation layer 15 is formed by oxidizing an upper surface layer of the body region 3 using an oxidation process. The isolation layer 15 has a thickness of 2 nm to 50 nm.

Figure 5:
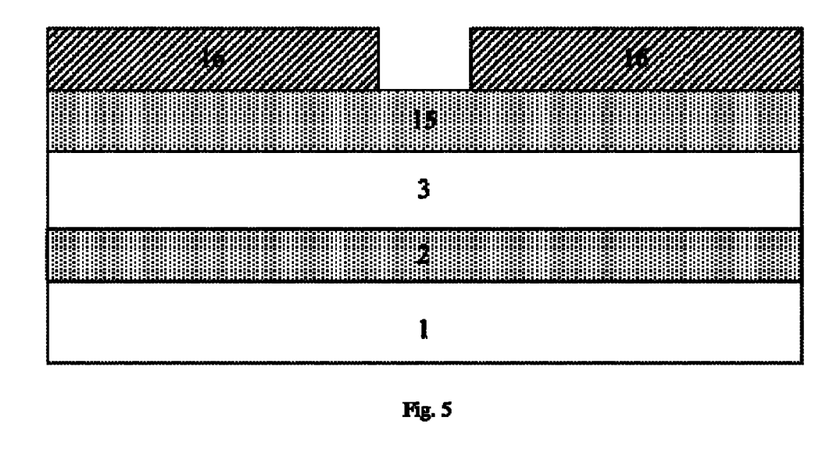
Figure 6:
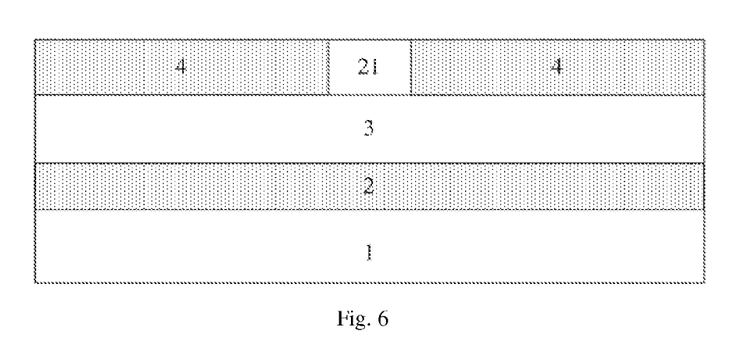

Step S5): a lithography is performed and a portion of the isolation layer 15 is etched until a first portion of the body region 3 is exposed to form two isolation regions 4, and a semiconductor contact region 21 is formed between the two isolation regions 4, in which the semiconductor contact region 21 is a charge channel, as shown in FIGS. 5-6. Particularly, Step S5) comprises: performing a lithography by coating a photoresist layer 16, exposing, developing and baking to form a patterned structure as shown in FIG. 5; and then etching the portion of the isolation layer 15 until the first portion of the body region 3 is exposed to form a window in the isolation layer 15, so as to form the two isolation regions 4. A process for etching the portion of the isolation layer 15 may be, but is not limited to, wet corrosion or dry etching. A patterned structure formed after the etching is shown in FIG. 6. Particularly, a material of the two isolation regions 4 may be, but is not limited to, an oxide of silicon or an oxide of germanium. In this embodiment, preferably, the material of the two isolation regions 4 may be an oxide of silicon. Each isolation region 4 has a thickness of 2 nm to 50 nm.

Figure 7:
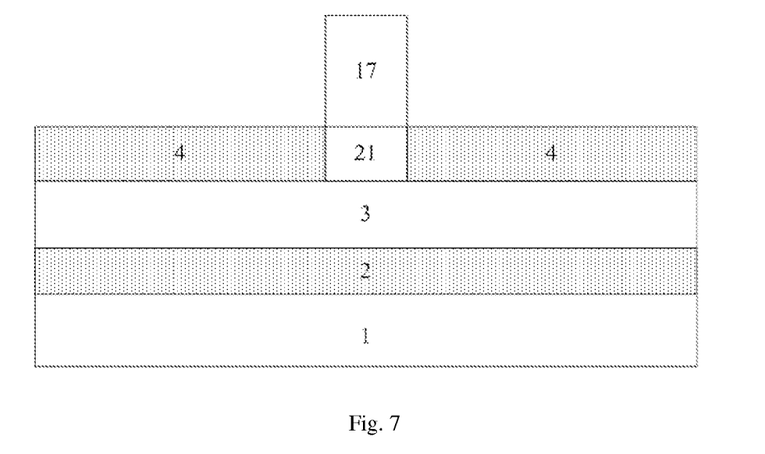
Figure 8:
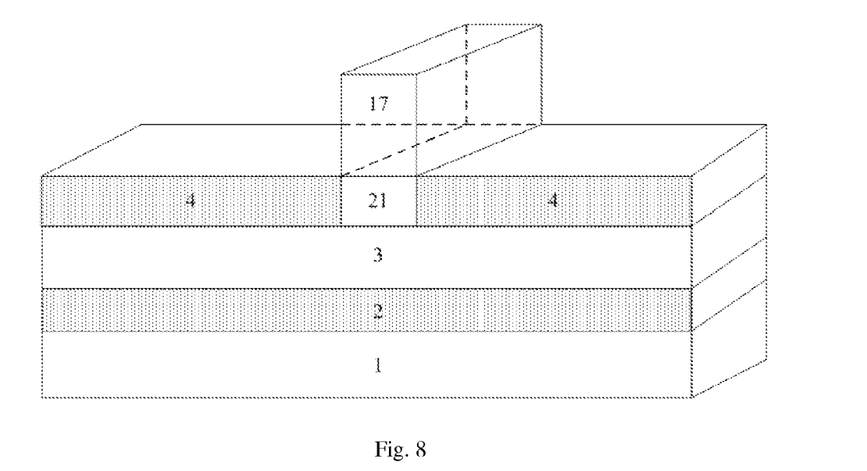
Figure 9:
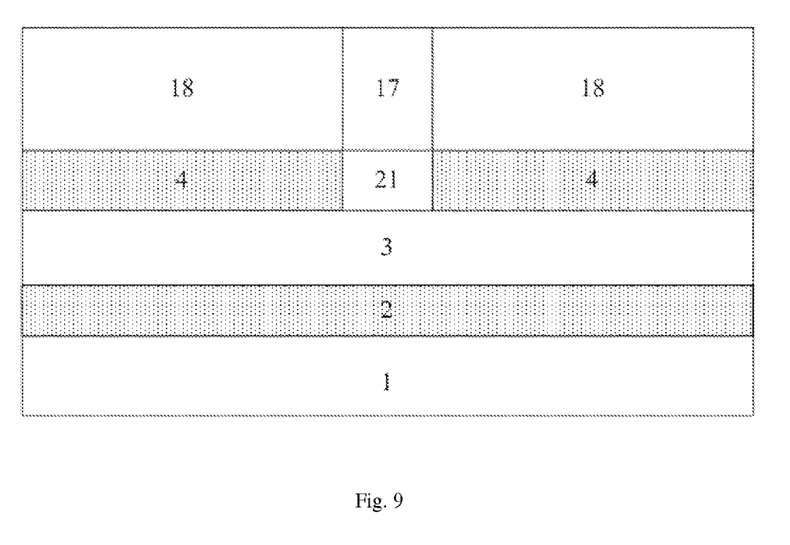

Step S6): an epitaxial layer is formed on the two isolation regions 4 and the semiconductor contact region 21, and a source 5, a drain 6 and a channel region 7 are formed in the epitaxial layer respectively, in which the source 5, the drain 6 and the channel region 7 constitute a transistor operating region, the transistor operating region is spatially partially separated from the charge storing region by the two isolation regions 4, and the transistor operating region is connected with the charge storing region via the charge channel, as shown in FIGS. 7-9. The epitaxial layer comprises a first semiconductor layer 17 and two second semiconductor layers 18. Particularly, Step S6) comprises: forming the first semiconductor layer 17 on the first portion of the body region 3 by selective epitaxial growth, as shown in FIGS. 7-8; forming the two second semiconductor layers 18 on the two isolation regions 4 by epitaxial lateral overgrowth respectively, as shown in FIG. 9; and then forming the channel region 7 in the first semiconductor layer 17, and forming the source 5 and the drain 6 in the two second semiconductor layers 18 respectively. A particular process of selective epitaxial growth and epitaxial lateral overgrowth may be, but is not limited to, chemical vapor deposition. A material of the first semiconductor layer 17 may be, but is not limited to, silicon. A material of the two second semiconductor layers 18 may be, but is not limited to, silicon (Si) or silicon germanium (SiGe). A process for forming the source 5 and the drain 6 may be, but is not limited to, a process of performing a lithography, performing an ion-implanting using a mask, diffusing and annealing. A length of the charge channel in a channel direction of the channel region 7 is about 5 nm to about 100 nm, and a depth of the charge channel in a depth direction vertical to the transistor operating region is about 2 nm to about 50 nm.

Figure 14:
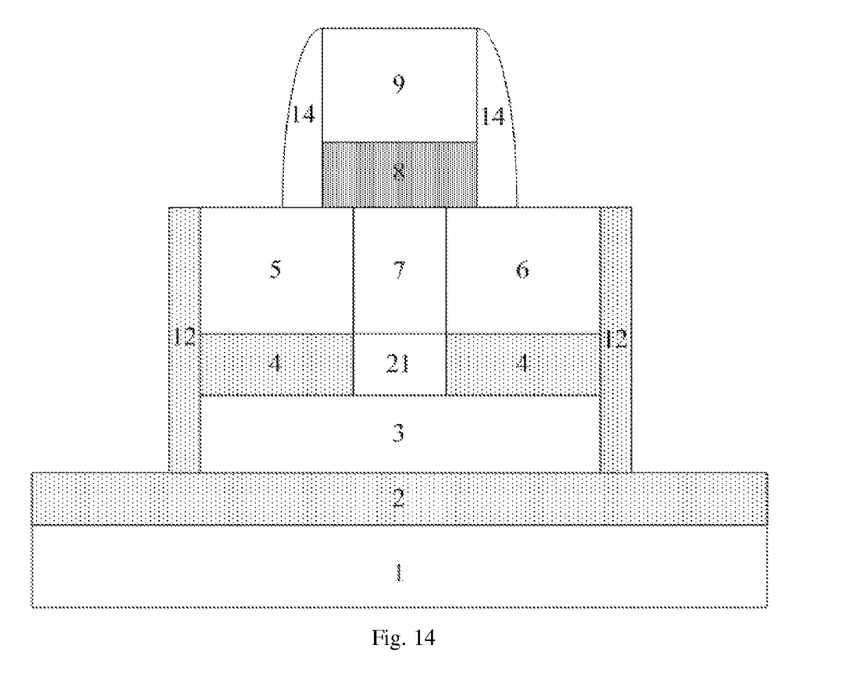

Step S7): a gate dielectric layer 8 is formed on the transistor operating region, and a gate 9 is formed on the gate dielectric layer 8, as shown in FIGS. 13-14. Particularly, a material of the gate dielectric layer 8 may be, but is not limited to, a high k dielectric or silicon dioxide ($SiO_2$). Particularly, a material of the gate 9 may be, but is not limited to, poly-silicon or a metal.

Step S8): a source metal contact layer 10 is formed on the source 5, and a drain metal contact layer 11 is formed on the drain 6, as shown in FIG. 2. In this embodiment, an ohmic contact is formed between the source metal contact layer 10 and the source 5, and an ohmic contact is formed between the drain metal contact layer 11 and the drain 6. Particularly, a material of an interface between the source metal contact layer 10 and the source 5 and an interface between the drain metal contact layer 11 and the drain 6 may be, but is not limited to, a metal-semiconductor alloy, such as a metal silicide.

In one embodiment, the material of the two isolation regions 4 is nonconductive. In another embodiment, a conductive material is used to form the isolation layer 15 on the body region 3, and after the transistor operating region is formed, the conductive material in the two isolation regions 4 is removed and a nonconductive material is filled in the two isolation regions 4. Particularly, the nonconductive material may be, but is not limited to, an oxide of silicon.

In one embodiment, in Steps S4)-S6), the two isolation regions 4 and the transistor operating region may be formed by: coating a photoresist and performing a lithography until a second portion of the body region 3 is exposed; ion-implanting oxygen in the second portion of the body region 3 to form an oxygen ion-implanted region, removing the photoresist, and performing a high-temperature annealing to form the two isolation regions 4, in which the first portion of the body region 3 between the two isolation regions 4 is the semiconductor contact region 21, and the semiconductor contact region 21 is the charge channel; and forming the source 5, the drain 6 and the channel region 7 on the two isolation regions 4 and the semiconductor contact region 21 respectively, in which the source 5, the drain 6 and the channel region 7 constitute the transistor operating region, the transistor operating region is spatially partially separated from the charge storing region by the two isolation regions 4, and the transistor operating region is connected with the charge storing region via the charge channel.

In one embodiment, between Step S6) and Step S7), the method for fabricating the dynamic random access memory unit according to the fourth embodiment of the present disclosure may further comprise: forming an isolation trench 12 on peripheries of the body region 3, the two isolation regions 4 and the transistor operating region, and filling an insulating isolation dielectric in the isolation trench 12. Particularly, the insulating isolation medium may be, but is not limited to, an oxide of silicon. In one embodiment, the isolation trench 12 may be formed by chemical vapor deposition. In another embodiment, the isolation trench 12 may be formed by oxidizing surface layers of outer circumferential surfaces of the body region 3 and the transistor operating region. The isolation trench 12 is used for isolating one dynamic random access memory unit from other dynamic random access memory units, thus preventing charges accumulated in a charge accumulation layer formed between the body region 3 and the insulating buried layer 2 of the one dynamic random access memory unit from leaking into the other dynamic random access memory units.

Figure 10:
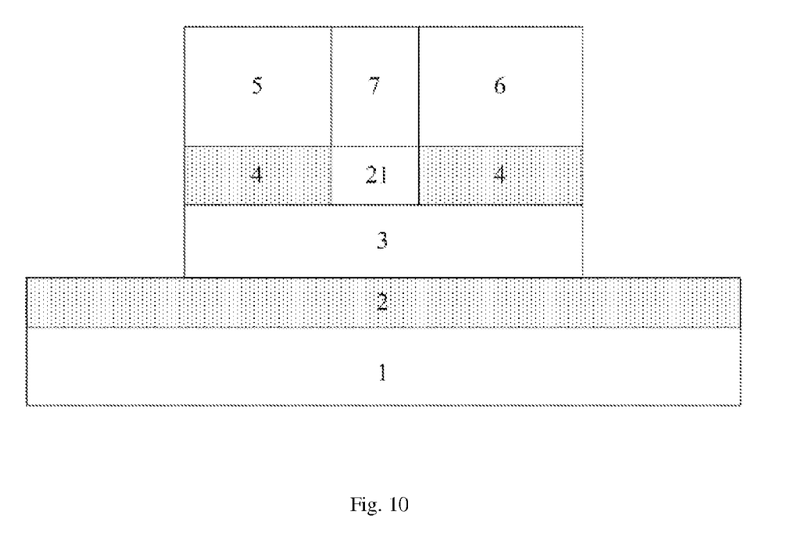
Figure 11:
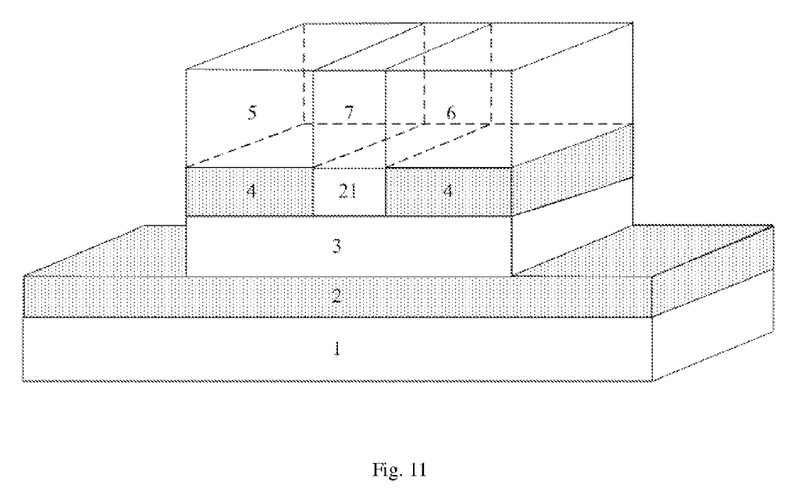
Figure 12:
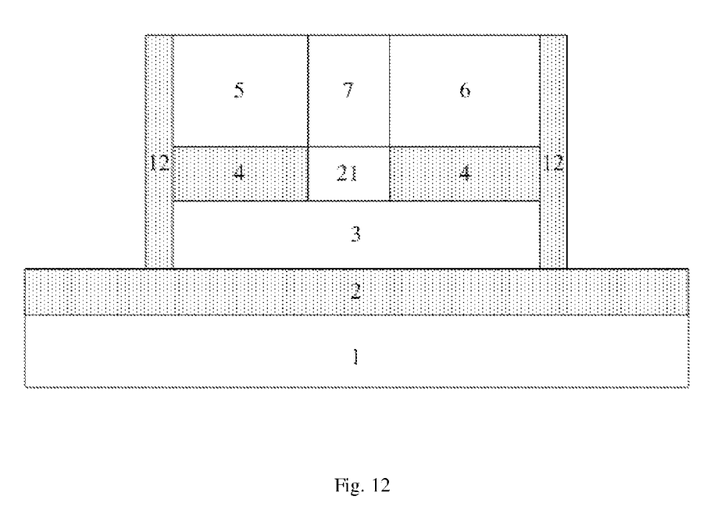

Particularly, the isolation trench 12 may be formed by firstly, performing a lithography, and etching a portion of the source 5, a portion of the drain 6, portions of the two isolation regions 4 and a third portion of the body region 3 until a portion of the insulating buried layer 2 is exposed, as shown in FIGS. 10-11; and then forming the isolation trench 12 on peripheries of the body region 3, the two isolation regions 4 and the transistor operating region, and filling the insulating isolation dielectric in the isolation trench 12, as shown in FIG. 12. A process for etching the portion of the source 5, the portion of the drain 6 portions of the two isolation regions 4 and the third portion of the body region 3 may be, but is not limited to, wet corrosion or dry etching. Particularly, the insulating isolation medium may be, but is not limited to, an oxide of silicon. Particularly, a process for forming the isolation trench 12 may be, but is not limited to, chemical vapor deposition or oxidation. In this embodiment, the isolation trench 12 may be formed by oxidizing surface layers of outer circumferential surfaces of the body region 3 and the transistor operating region. A semiconductor structure formed after forming the isolation trench 12 is shown in FIG. 12. As shown in FIG. 12, sides of the device are surrounded by the isolation trench 12, thus enhancing the reliability and life of the device.

In one embodiment, after the isolation trench 12 is formed, the gate dielectric layer 8, the gate 9, the source metal contact layer 10 and the drain metal contact layer 11 are formed respectively. Particularly, the gate dielectric layer 8, the gate 9, the source metal contact layer 10 and the drain metal contact layer 11 are formed by: forming the gate dielectric layer 8 on the transistor operating region, and forming the gate 9 on the gate dielectric layer 8, as shown in FIG. 13; and then forming the source metal contact layer 10 on the source 5, and forming the drain metal contact layer 11 on the drain 6, so as to form the dynamic random access memory unit shown in FIG. 2.

In one embodiment, the method for fabricating the dynamic random access memory unit according to the fourth embodiment of the present disclosure may further comprise: forming a side wall 14 on each side of a gate stack constituted by the gate dielectric layer 8 and the gate 9, as shown in FIG. 13.

In one embodiment, the method for fabricating the dynamic random access memory unit according to the fourth embodiment of the present disclosure may further comprise: forming a passivation layer 13 on an upper surface of the transistor operating region which is not covered by the gate dielectric layer 8, the source metal contact layer 10 or the drain metal contact layer 11. In another embodiment, if the side wall 14 is formed on each side of the gate stack, the passivation layer 13 is formed on an upper surface of the transistor operating region which is not covered by the gate dielectric layer 8, the source metal contact layer 10, the drain metal contact layer 11 or the side wall 14. In one embodiment, the passivation layer 13 may be formed by chemical vapor deposition, for example, the passivation layer 13 may be formed by depositing silicon dioxide on the upper surface of the transistor operating region by chemical vapor deposition. Particularly, a material of the passivation layer 13 may be, but is not limited to, an oxide of silicon or a nitride of silicon. The passivation layer 13 may passivate a surface of the transistor operating region, thus preventing the charge leakage.

In one embodiment, the method for fabricating the dynamic random access memory unit according to the fourth embodiment of the present disclosure may further comprise: forming a substrate electrode (not shown) below the substrate 1.

In one embodiment, the method for fabricating the dynamic random access memory unit according to the fourth embodiment of the present disclosure may further comprise: forming a plurality of metallic interconnections (not shown) on the source metal contact layer 10, the drain metal contact layer 11 and the gate 9 respectively.

With the method for fabricating the dynamic random access memory unit according to an embodiment of the present disclosure, the process is simple and is compatible with a CMOS process; and with the dynamic random access memory unit fabricated by the method, during the reading, the charges stored in the body region may not be destroyed, thus increasing the maximum refresh time.

Embodiment 5

A method for fabricating a dynamic random access memory unit according to a fifth embodiment of the present disclosure is used for fabricating the dynamic random access memory unit according to the second embodiment of the present disclosure. The method for fabricating the dynamic random access memory unit according to the fifth embodiment of the present disclosure is substantially the same as the method for fabricating the dynamic random access memory unit according to the fourth embodiment of the present disclosure, with the following exceptions. In this embodiment, as shown in FIG. 15, a quantum well for storing a carrier is formed in the body region 3. When the channel region 7 is p-type doped, the body region 3 is an intrinsic region or a p-type doped region, a material of a potential well layer 202 of the quantum well is strained SiGe, and a material of a potential barrier layer 201 of the quantum well is relaxed Si, so as to store holes. When the channel region 7 is n-type doped, the body region 3 is an intrinsic region or an n-type doped region, the material of the potential barrier layer 201 of the quantum well is relaxed SiGe, and the material of the potential well layer 202 of the quantum well is strained Si, so as to store electrons. A process for forming the quantum well may be, but is not limited to, chemical vapor deposition. It should be noted that the number of the quantum wells, the thickness of the potential barrier layer 201, and the thickness of the potential well layer 202 may be designed according to practical parameter requirements.

With the method for fabricating the dynamic random access memory unit according to an embodiment of the present disclosure, the quantum well for storing carriers is introduced in a carrier storing region (i.e., the body region), thus increasing the data retention time dramatically and increasing the maximum refresh time.

Embodiment 6

Figure 19:
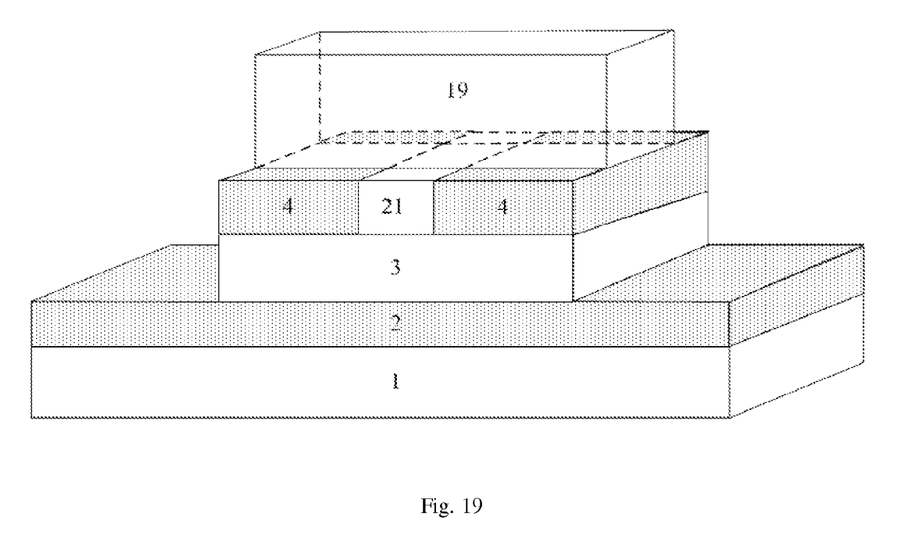
FIG. 19 is a schematic cross-sectional view of an intermediate status of the dynamic random access memory unit shown in FIG. 16 formed in a step of a method for fabricating the dynamic random access memory unit shown in FIG. 16.

A method for fabricating a dynamic random access memory unit according to a sixth embodiment of the present disclosure is used for fabricating the dynamic random access memory unit according to the third embodiment of the present disclosure. FIG. 19 is a schematic cross-sectional view of an intermediate status of the dynamic random access memory unit shown in FIG. 16 formed in a step of a method for fabricating the dynamic random access memory unit shown in FIG. 16. The method for fabricating the dynamic random access memory unit according to the sixth embodiment of the present disclosure is substantially the same as the method for fabricating the dynamic random access memory unit according to the fourth embodiment of the present disclosure, with the following exceptions. In this embodiment, as shown in FIGS. 16-18, the transistor operating region, the gate dielectric layer 8, the gate 9, the source metal contact layer 10 and the drain metal contact layer 11 constitute a FinFET structure. After Step S5), the method for fabricating the dynamic random access memory unit according to the sixth embodiment of the present disclosure may further comprise steps of: performing a lithography, etching portions of the two isolation regions 4 and a third portion of the body region 3 until a portion of the insulating buried layer 2 is exposed; forming the isolation trench 12 on peripheries of the body region 3 and the two isolation regions 4; forming a Fin structure 19 on the two isolation regions 4 and the semiconductor contact region 21, as shown in FIG. 19; forming the source 5, the drain 6 and the channel region 7 in the Fin structure 19 respectively; forming the gate dielectric layer 8 on the Fin structure 19, and forming the gate 9 on the gate dielectric layer 8, in which the gate dielectric layer 8 is in contact with the two isolation regions 4 and the semiconductor contact region 21; forming the source metal contact layer 10 on the source 5, and forming the drain metal contact layer 11 on the drain 6; and forming the passivation layer 13 on upper surfaces of the two isolation regions 4 which are not covered by the Fin structure 19, the gate dielectric layer 8, the source metal contact layer 10 or the drain metal contact layer 11, as shown in FIG. 16.

In one embodiment, a method for fabricating a silicon-based dynamic random access memory unit comprises the following steps. Firstly, an insulating buried layer 2 is deposited on a lightly doped p-type silicon substrate 1 by chemical vapor deposition. It should be noted that, the dynamic random access memory unit fabricated on a p-type substrate is taken as an example in this embodiment, and a dynamic random access memory unit fabricated on an n-type substrate may be fabricated using a doping type opposite to that used in the dynamic random access memory unit fabricated on the p-type substrate. Then, lightly doped p-type silicon is deposited on the insulating buried layer 2 by chemical vapor deposition to form a body region 3, and an upper surface layer of the body region 3 is oxidized using an oxidation process to form silicon oxide, so as to form an isolation layer 15 with a thickness of 20 nm. Thereafter, a lithography is performed by coating a photoresist layer 16, exposing, developing and baking, and then a portion of the isolation layer 15 is etched until a first portion of the body region 3 is exposed to form a window in the isolation layer 15, so as to form two isolation regions 4. Then, a silicon epitaxial layer is formed in the window in the isolation layer 15 and the two isolation regions 4 by chemical vapor deposition, a channel region 7 is formed in the silicon epitaxial layer, and a source 5 and a drain 6 are formed in the silicon epitaxial layer by a process of performing a lithography, performing an ion-implanting using a mask, diffusing and annealing respectively, in which the source 5, the drain 6 and the channel region 7 constitute a transistor operating region. Thereafter, a lithography is performed, and a portion of the source 5, a portion of the drain 6, portions of the two isolation regions 4 and a third portion of the body region 3 are etched using a dry etching process until a portion of the insulating buried layer 2 is exposed. Subsequently, surface layers of outer circumferential surfaces of the body region 3 and the transistor operating region are oxidized using an oxidation process to form an isolation trench 12. Then, a gate dielectric layer 8 is formed on the transistor operating region, a gate 9 is formed on the gate dielectric layer 8, a source metal contact layer 10 is formed on the source 5, and a drain metal contact layer 11 is formed on the drain 6. Subsequently, a passivation layer 13 is formed on an upper surface of the transistor operating region by chemical vapor deposition. Finally, the substrate 1 is thinned, and a substrate electrode (not shown) is formed below the substrate 1.

In another embodiment, a method for fabricating a silicon-based dynamic random access memory unit comprises the following steps. Firstly, an insulating buried layer 2 is deposited on a lightly doped p-type SOI substrate 1 by chemical vapor deposition. It should be noted that, the dynamic random access memory unit fabricated on a p-type substrate is taken as an example in this embodiment, and a dynamic random access memory unit fabricated on an n-type substrate may be fabricated using a doping type opposite to that used in the dynamic random access memory unit fabricated on the p-type substrate. Then, lightly doped p-type silicon is deposited on the insulating buried layer 2 by chemical vapor deposition to form a body region 3. Thereafter, a fully strained SiGe layer and a fully strained Si layer are formed on the body region 3 by chemical vapor deposition sequentially, and the fully strained SiGe layer is used as a sacrificial layer. Subsequently, a $Si_3N_4$ layer is deposited by plasma enhanced chemical vapor deposition and used as a mask layer, a patterned window is formed using a lithography and an etching technique, portions of the $Si_3N_4$ layer, the Si layer and the SiGe layer are removed by etching to form two isolation regions 4 and a charge channel. Then, the remaining $Si_3N_4$ layer is removed, and a Si epitaxy is performed by chemical vapor deposition to form a transistor operating region. Subsequently, SiGe in the two isolation regions 4 is removed by etching, and a nonconductive material is filled in the two isolation regions 4. Thereafter, a source 5, a drain 6 and a channel region 7 are formed in the transistor operating region respectively, in which the source 5 and the drain 6 are formed by a process of performing a lithography, performing an ion-implanting using a mask, diffusing and annealing respectively. Subsequently, an isolation trench 12 between different dynamic random access memory units is formed. Finally, a gate dielectric layer 8 is formed on transistor operating region, and a gate 9 is formed on the gate dielectric layer 8, a source metal contact layer 10 is formed on the source 5, and a drain metal contact layer 11 is formed on the drain 6.

With the dynamic random access memory unit fabricated by the above-mentioned method, the information storing may be achieved by changing a charge quantity in the body region. When a storing state is "1", holes (i.e., positive charges) are stored in the body region of the device, so that the potential of the body region may be increased. Because of the substrate bias effect, the threshold voltage of the device may be decreased. When the storing state is "0", the charge quantity in the body region of the device is zero, so that the potential of the substrate is decreased and the threshold voltage of the device may return to a normal value. If a voltage between the threshold voltage of the device when the storing state is "1" and the threshold voltage of the device when the storing state is "0" is applied to the gate, the stored information may be determined by determining whether the device is on or off.

When "1" is written, if the source is at a low potential and the drain and the gate are at a high potential by using the hot carrier injection effect, the hot carrier effect may occur at the drain by the carriers in the channel to produce a substrate hole current, so that the holes may be injected into the body region. When "0" is written, any or both of the source and the drain are at a low voltage to forward bias a p-n junction between the source and the body region or between the drain and the body region, thus dissipating the charges from the body region.

During the read operation, because the turn-on voltages of the "1" state and the "0" state are different, by applying a voltage between the threshold voltage of the device when the storing state is "1" and the threshold voltage of the device when the storing state is "0" to the gate, the stored information may be determined by determining whether the device is on or off.

With the dynamic random access memory unit according to an embodiment of the present disclosure, during the reading and writing, p-n junctions between the source and the substrate and between the drain and the substrate are both reverse biased, and the channel region is isolated from the body region by a depletion layer, so that charges stored in the body region may not be affected by the leakage voltages of the gate, the source and the drain and the maximum refresh time may be increased. When the stored data need to be retained, moderate voltages are applied to the gate, the source and the drain respectively, so as to ensure that the p-n junction between the source and the body region or between the drain and the body region is not forward biased and the hot carrier injection may not occur in the channel.

With the dynamic random access memory unit according to an embodiment of the present disclosure, generated carries are stored in the charge storing region below the transistor, and the transistor operating region is spatially separated from the charge storing region, thus reducing the charge leakage dramatically and increasing the data retention time. The charges stored in the charge storing region may not be destroyed when the data is read, thus increasing the maximum refresh time.

Reference throughout this specification to "an embodiment," "some embodiments," "one embodiment", "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that the above embodiments can not be construed to limit the present disclosure, and changes, alternatives, and modifications can be made in the embodiments without departing from spirit, principles and scope of the present disclosure.

What is claimed is:
1. A dynamic random access memory unit, comprising:
a substrate;
an insulating buried layer formed on the substrate;
a body region formed on the insulating buried layer and used as a charge storing region;
two isolation regions formed on the body region, wherein a material of the two isolation regions is nonconductive, and a semiconductor contact layer is formed between the two isolation regions and is a charge channel;
a source, a drain and a channel region formed on the two isolation regions and the semiconductor contact region respectively and constituting a transistor operating region, wherein the transistor operating region is spatially partially separated from the charge storing region by the two isolation regions, and the transistor operating region is connected with the charge storing region via the charge channel;
a gate dielectric layer formed on the transistor operating region, and a gate formed on the gate dielectric layer; and
a source metal contact layer formed on the source, and a drain metal contact layer formed on the drain.

2. The dynamic random access memory unit according to claim 1, further comprising:
an isolation trench formed on peripheries of the body region, the two isolation regions and the transistor operating region.

3. The dynamic random access memory unit according to claim 1, wherein the transistor operating region, the gate dielectric layer, the gate, the source metal contact layer and the drain metal contact layer constitute a FinFET structure.

4. The dynamic random access memory unit according to claim 1, wherein a length of the charge channel in a channel direction of the channel region is about 5 nm to about 100 nm, and a depth of the charge channel in a depth direction vertical to the transistor operating region is about 2 nm to about 50 nm.

5. The dynamic random access memory unit according to claim 1, wherein the body region comprises a quantum well for storing a carrier.

6. The dynamic random access memory unit according to claim 5, wherein when the channel region is p-type doped, the body region is an intrinsic region or a p-type doped region, a material of a potential well layer of the quantum well is strained SiGe, and a material of a potential barrier layer of the quantum well is relaxed Si.

7. The dynamic random access memory unit according to claim 5, wherein when the channel region is n-type doped, the body region is an intrinsic region or an n-type doped region, a material of a potential barrier layer of the quantum well is relaxed SiGe, and a material of a potential well layer of the quantum well is strained Si.

8. The dynamic random access memory unit according to claim 1, further comprising:
a passivation layer formed on an upper surface of the transistor operating region which is not covered by the gate dielectric layer, the source metal contact layer or the drain metal contact layer.

* * * * *